United States Patent
Vashchenko et al.

(10) Patent No.: US 7,268,398 B1
(45) Date of Patent: Sep. 11, 2007

(54) ESD PROTECTION CELL WITH ACTIVE PWELL RESISTANCE CONTROL

(75) Inventors: Vladislav Vashchenko, Palo Alto, CA (US); Ann Concannon, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/503,693

(22) Filed: Aug. 14, 2006

(51) Int. Cl.
*H01L 23/60* (2006.01)
*H01L 82/8249* (2006.01)
*H02H 3/20* (2006.01)

(52) U.S. Cl. .............. 257/355; 257/356; 257/357; 257/360; 257/361; 257/E29.242; 257/E29.255; 257/E29.263; 361/91.5; 438/202

(58) Field of Classification Search ........ 257/355–357, 257/360–361; 361/91.5; 438/202
See application file for complete search history.

(56) References Cited

U.S. PATENT DOCUMENTS

| | | | |
|---|---|---|---|
| 5,416,351 A * | 5/1995 | Ito et al. ...................... | 257/357 |
| 6,242,793 B1 * | 6/2001 | Colombo et al. ............ | 257/556 |
| 2005/0145945 A1 * | 7/2005 | Zdebel et al. ............... | 257/355 |
| 2005/0275027 A1 * | 12/2005 | Mallikarjunaswamy ..... | 257/355 |

* cited by examiner

*Primary Examiner*—Evan Pert
(74) *Attorney, Agent, or Firm*—Jurgen Vollrath

(57) ABSTRACT

In an NMOS device, the turn-on voltage or the triggering voltage is reduced by adding an NBL connected to an n-sinker and contacted through an n+ region, which is connected to a bias voltage. The bias voltage may be provided by the drain contact or by a separate bias voltage.

12 Claims, 1 Drawing Sheet

ESD PROTECTION CELL WITH ACTIVE PWELL RESISTANCE CONTROL

FIELD OF THE INVENTION

The invention relates to Electrostatic Discharge (ESD) devices. In particular it relates to ESD devices implemented in a BiCMOS process.

BACKGROUND OF THE INVENTION

Integrated circuits that include MOS transistors are particularly susceptible to damage by electrostatic discharge (ESD) events, e.g. when the circuit is touched by a person handling the circuit causing static electricity to discharge from the handler through the circuit. This is particularly the case once the circuit has been packaged but prior to it being installed in a product.

Different protection circuits have been developed to deal with ESD events, including CMOS transistors and SCR devices that shunt ESD current to ground. The CMOS transistors may be implemented as normal operation devices or as snapback devices.

The advantage of using snapback NMOS devices for ESD protection of analog circuits is that they can be implemented using the same process steps for the supported analog circuit. The disadvantage is that the NMOS protection devices therefore also have similar characteristics as the supported or protected circuit devices. This creates a problem since the ESD protection device clearly should have a lower turn-on or triggering voltage than the circuit it is protecting.

The present invention seeks to provide an ESD protection device implemented in a BiCMOS process that has a lower turn-on voltage characteristic.

SUMMARY OF THE INVENTION

According to the invention there is provided an ESD protection structure implemented in a BiCMOS process, having an n+ drain region and an n+ source region separated by a p-well or p-substrate, and further including a vertical NPN transistor with an NBL and n-sinker connecting to an n+ collector region, the n+ collector region being connected to a bias voltage. The bias voltage can be provided by the drain region by connecting the collector region to the drain region, or can be a separate bias voltage.

Further according to the invention there is provided an ESD protection structure comprising an n+ drain region and an n+ source region formed in a p-well or p-substrate, and an n-buried layer connected to an n-sinker and biased through an n+ contact region. The biasing of the n-buried layer may be achieved by connecting the n+ contact to the n+ drain region or to a separate bias voltage. For purposes of this application, the n-buried layer and n-sinker will also be referred to as a sub-collector since it forms a vertical NPN transistor with the p-well or p-substrate and the n+ source region.

Still further, according to the invention there is provided a method of reducing the triggering voltage or turn-on voltage of an NMOS ESD protection structure that includes an n+ drain region and an n+ source region formed in a p-well, comprising providing a sub-collector under the p-well of the NMOS structure, and biasing the sub-collector to partially deplete the p-well. Providing the sub-collector may include providing an n-buried layer under the p-well and biasing the p-well through an n-sinker extending to the n-buried layer. The biasing may include connecting the sub-collector to the n+ drain region, either directly or through a resistor. Instead the sub-collector can be separately biased. The method may include varying the amount of biasing to achieve varying turn-on voltages.

DETAILED DESCRIPTION OF THE INVENTION

Figure 1:
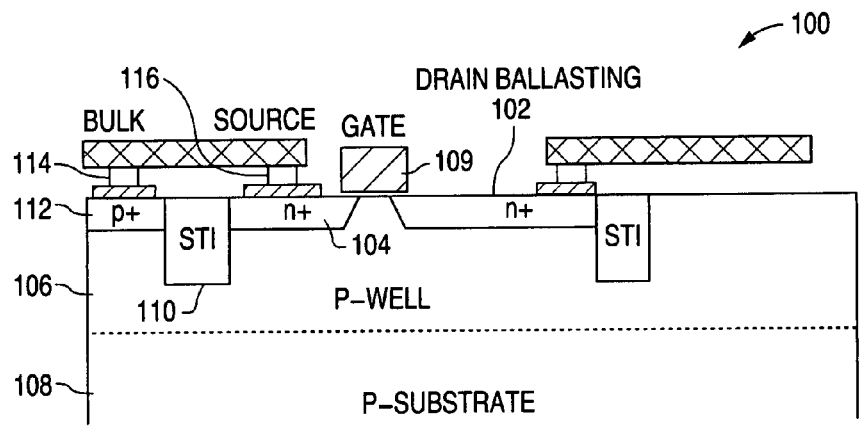
FIG. 1 is a circuit diagram of a prior art NMOS ESD protection structure.

In a CMOS process, the NMOS ESD protection device has its operation dictated by the parasitic NPN BJT that is inherent in the structure. In particular, the base resistance of the parasitic NPN BJT, which is determined by the p-well of the NMOS device, is important in determining the ESD operation. Such a CMOS ESD protection structure is shown in FIG. 1, which shows a cross section through an NMOS device 100 with its n+ drain 102 and n+ source 104 formed in a p-well 106, which is in turn, formed in a p-substrate 108. A gate 109 is formed over the channel region between the drain 102 and source 104. For convenience the present application will refer loosely and interchangeably to the p-type region in which the drain and source are formed as the p-substrate and the p-well. The n+ source 104 is separated by a shallow trench isolation region (STI) 110 from a p+ region 112, which facilitates the contact to the p-well by contact 114 (also referred to as the bulk contact 114) As shown in FIG. 1, the source contact 116 is connected to the bulk contact 114 in this ESD protection configuration. The parasitic NPN BJT is defined by the N+ drain and source regions and the intervening p-well 106 which is contacted by the bulk contact 114 and defines the base of the BJT.

Figure 2:
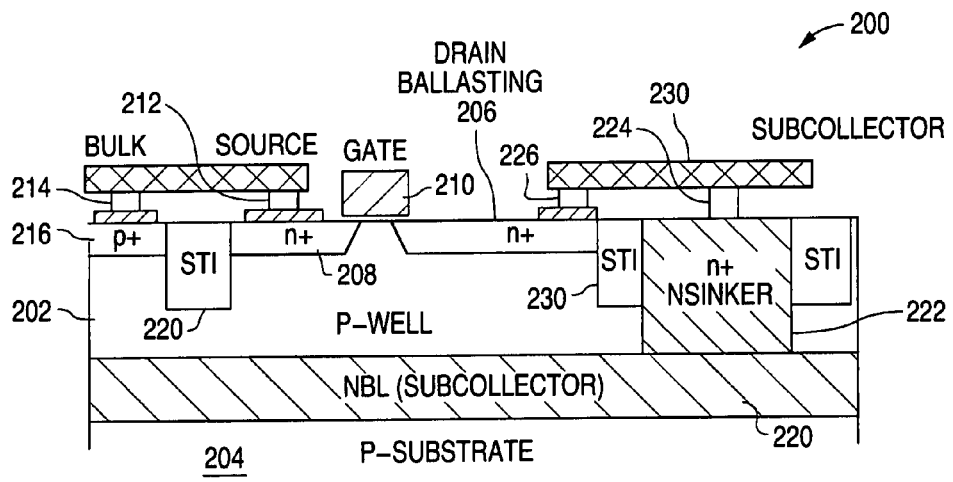
FIG. 2 is a circuit diagram of one embodiment of an ESD protection structure of the invention.

According to the present invention, a vertical NPN BJT structure is added to an NMOS structure as part of a BiCMOS process. One embodiment of such an ESD protection structure is shown in FIG. 2. The ESD protection structure 200 includes a p-well 202 formed in p-substrate 204. The NMOS device is defined by an n+ drain region 206 and n+ source region 208 formed in the p-well 202. A gate 210 is formed above the channel between the drain 206 and source 208. As in the prior art NMOS device of FIG. 1, the source 208 is connected through a source contact 212 to a bulk contact 214. The bulk contact 214 again provides a contact to the p-well 202 by means of a p+ region 216, which is separated from the n+ source 208 by means of a shallow trench isolation region (STI) 220.

In addition, the structure 200 includes a vertical NPN BJT by introducing a sub-collector in the form of a n-buried layer (NBL) 220 and n-sinker 222 which are contacted by a sub-collector contact 224. (It will be appreciated that the emitter of the vertical NPN is formed by the drain region 206 and the base is defined by the p-well 202.) As shown in FIG. 2, the n-sinker 222 is separated from the n+ drain 206 by means of a shallow trench isolation (STI) region 230.

By positively biasing the NBL 220 the positive charge carriers in the p-well 202 are repelled to form a partial depletion region in the p-well, which lowers the turn-on voltage of the parasitic bipolar device. In this embodiment the biasing of the NBL 220 is achieved by connecting the sub-collector contact 224 to the drain contact 226, e.g. by means of metal layer 230. In other embodiments the biasing of the NBL 220 is achieved by connecting the sub-collector contact 224 to a separate biasing voltage source. It will also be appreciated that the bias voltage to the NBL 220 could instead be adjusted by providing the appropriate resistor between the drain contact 226 and the sub-collector contact 224. Thus the present invention provides for an active sub-collector region, and that the bias voltage of the sub-collector can further be adjusted by adjusting the degree of depletion of the p-well, which controls the resistance of the p-well 202.

Thus the present invention provides an NMOS ESD protection structure in a BiCMOS process wherein the triggering voltage is lowered through the provision of an active sub-collector region.

While the present invention was described with respect to a specific embodiment, it will be appreciated that variations of the device could be provided without departing from the scope of the invention as claimed.

What is claimed is:

1. An ESD protection structure implemented in a BiCMOS process, comprising
    an n+ drain region,
    an n+ source region separated from the n+ drain region by a p-well or p-substrate, and
    a vertical NPN transistor with an NBL and n-sinker connecting to an n+ collector region, the n+ collector region being connected to a bias voltage.

2. A structure of claim 1, wherein the n+ collector and n-sinker are isolated from the n+ drain region by a shallow trench isolation region.

3. A structure of claim 1, wherein the bias voltage is provided by the drain region by connecting the n+ collector region to the n+ drain region.

4. A structure of claim 1, wherein the bias voltage is provided by connecting the n+ collector region to a separate bias voltage.

5. An ESD protection structure comprising
    an n+ drain region
    an n+ source region formed in a p-well or p-substrate, and
    an n-buried layer connected to an n-sinker, wherein the n-buried layer and n-sinker are biased through an n+ contact region.

6. A structure of claim 5, wherein the biasing of the n-buried layer and n-sinker may be achieved by connecting the n+ contact region to a separate bias voltage.

7. A structure of claim 5, wherein the biasing of the n-buried layer and n-sinker may be achieved by connecting the n+ contact region to the n+ drain region.

8. A method of reducing the triggering voltage or turn-on voltage of an NMOS ESD protection structure that includes an n+ drain region and an n+ source region formed in a p-well, comprising
    providing a sub-collector of an NPN structure under the p-well of the NMOS structure, and
    biasing the sub-collector to partially deplete the p-well.

9. A method of claim 8, wherein providing the sub-collector includes providing an n-buried layer under the p-well and biasing the p-well through an n-sinker to the n-buried layer.

10. A method of claim 9, wherein the biasing includes connecting the sub-collector to the n+ drain region, directly or through a resistor.

11. A method of claim 9, wherein the biasing includes connecting the sub-collector to a separate bias voltage.

12. A method of claim 8, further comprising varying the amount of biasing to achieve varying turn-on or trigger voltages.

* * * * *